United States Patent
Jung et al.

(10) Patent No.: US 10,777,269 B2
(45) Date of Patent: Sep. 15, 2020

(54) SEMICONDUCTOR MEMORY DEVICE, SEMICONDUCTOR MEMORY MODULE, AND METHOD OF ACCESSING NONVOLATILE MEMORY

(71) Applicants: Jiwan Jung, Bucheon-si (KR); Anil Kavala, Yongin-si (KR); Taesung Lee, Hwaseong-si (KR); Jeongdon Ihm, Seongnam-si (KR)

(72) Inventors: Jiwan Jung, Bucheon-si (KR); Anil Kavala, Yongin-si (KR); Taesung Lee, Hwaseong-si (KR); Jeongdon Ihm, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 1 day.

(21) Appl. No.: 16/299,669

(22) Filed: Mar. 12, 2019

(65) Prior Publication Data
US 2020/0066336 A1    Feb. 27, 2020

(30) Foreign Application Priority Data
Aug. 21, 2018   (KR) .......................... 10-2018-0097448

(51) Int. Cl.
*G11C 13/00*     (2006.01)

(52) U.S. Cl.
CPC ........ *G11C 13/003* (2013.01); *G11C 13/0004* (2013.01); *G11C 13/004* (2013.01); *G11C 13/0026* (2013.01); *G11C 13/0028* (2013.01); *G11C 13/0069* (2013.01); *G11C 13/0097* (2013.01); *G11C 2213/79* (2013.01)

(58) Field of Classification Search
CPC .... G11C 7/04; G11C 11/40626; G11C 14/009
See application file for complete search history.

(56) References Cited

U.S. PATENT DOCUMENTS

| | | | |
|---|---|---|---|
| 7,956,342 B2 | 6/2011 | Non et al. | |
| 9,342,443 B2 | 5/2016 | Walker et al. | |
| 2012/0087183 A1* | 4/2012 | Chang | G11C 13/0033 365/163 |
| 2013/0301371 A1 | 11/2013 | Chen | |
| 2014/0211577 A1* | 7/2014 | Ryu | G11C 11/40626 365/189.16 |

(Continued)

*Primary Examiner* — Han Yang
(74) *Attorney, Agent, or Firm* — Volentine, Whitt & Francos, PLLC

(57) ABSTRACT

A semiconductor memory device may include banks. A sensor is disposed adjacent to the banks and configured to sense a temperature. An address buffer is configured to receive an address from an external device. A first demultiplexer is configured to transfer a row address in the address to one of the banks. A second demultiplexer is configured to transfer a column address in the address to one of the banks. A command buffer is configured to receive a command from the external device. A control logic block is configured to control the first and second demultiplexers and the banks in accordance with the command and bank information in the address. A data buffer is configured to exchange data signals between the banks and the external device. The control logic block may be further configured to transfer information on the temperature to the external device.

15 Claims, 11 Drawing Sheets

(56) References Cited

U.S. PATENT DOCUMENTS

| | | |
|---|---|---|
| 2016/0117216 A1 | 4/2016 | Muchheria et al. |
| 2016/0162219 A1 | 6/2016 | Erez |
| 2016/0172051 A1 | 6/2016 | Liang et al. |
| 2017/0090785 A1 | 3/2017 | Kashyap et al. |
| 2018/0102159 A1 | 4/2018 | Ong et al. |
| 2018/0107568 A1 | 4/2018 | Sheldon et al. |
| 2020/0027500 A1* | 1/2020 | Heymann ........... G06F 13/1668 |

* cited by examiner

SEMICONDUCTOR MEMORY DEVICE, SEMICONDUCTOR MEMORY MODULE, AND METHOD OF ACCESSING NONVOLATILE MEMORY

CROSS-REFERENCE TO RELATED APPLICATIONS

This U.S. non-provisional patent application claims priority under 35 U.S.C. § 119 to Korean Patent Application No. 10-2018-0097448, filed on Aug. 21, 2018, in the Korean Intellectual Property Office, the entire contents of which are hereby incorporated by reference.

BACKGROUND OF THE DISCLOSURE

The present disclosure relates to a semiconductor circuit, and in particular, to a semiconductor memory device configured to manage its heating process, a semiconductor memory module including the same, and a method of accessing a nonvolatile memory.

A semiconductor memory includes at least one of nonvolatile memories, such as a phase change memory, a ferroelectric memory, a magnetic memory, a resistive memory, and a FLASH memory. In particular, the phase change memory, which is one of the nonvolatile memories, is configured to change resistance values of memory cells through heating of the memory cells. In other words, when a set or reset operation is performed on a phase change memory, the memory cells of the phase change memory may be heated.

In the phase change memory, the heating of the memory cells may affect other memory cells adjacent thereto. For example, if the other adjacent memory cells are heated to a temperature required for the set or reset operation, resistance values of the other adjacent memory cells may be changed. In other words, the other adjacent memory cells may be disturbed.

SUMMARY

Some embodiments of the disclosure provide a semiconductor memory device, which is configured to manage a heating process in memory cells thereof, a semiconductor memory module including the same, and a method of accessing a nonvolatile memory.

According to some embodiments of the disclosure, a semiconductor memory device may include banks and a sensor disposed adjacent to the banks and configured to sense a temperature. An address buffer is configured to receive an address from an external device. A first demultiplexer is configured to transfer a row address, which is a part of the address received by the address buffer, to one of the banks. A second demultiplexer is configured to transfer a column address, which is a part of the address received by the address buffer, to one of the banks. A command buffer is configured to receive a command from the external device. A control logic block is configured to control the first demultiplexer, the second demultiplexer, and the banks in accordance with: (1) the command received by the command buffer and (2) bank information, which is a part of the address received by the address buffer. A data buffer is configured to exchange data signals between the banks and the external device. The control logic block may be further configured to transfer information on the temperature sensed by the sensor to the external device.

According to some embodiments of the disclosure, a semiconductor memory module may include first nonvolatile memory devices, a first temperature sensor associated with at least one first nonvolatile memory device of the first nonvolatile memory devices, second nonvolatile memory devices, a second temperature sensor associated with at least one second nonvolatile memory device of the second nonvolatile memory devices, data buffers, and a controller. The controller is configured to exchange first data signals with the data buffers through first data lines and to exchange second data signals with the first nonvolatile memory devices and the second nonvolatile memory devices through second data lines. The controller may further be configured to receive a first address, a first command, and a first control signal from an external device to control the first nonvolatile memory devices and the second nonvolatile memory devices through first control lines in accordance with the first address, the first command and the first control signal and to control the data buffers through second control lines. The controller may further be configured to output information on a temperature, which is sensed by the first temperature sensor or the second temperature sensor, to the external device.

According to some embodiments of the disclosure, a method of accessing a nonvolatile memory, which includes first phase change memory cells of a first region and second phase change memory cells of a second region, may include performing at least one set or reset operation on the first phase change memory cells of the first region and performing the at least one set or reset operation on the second phase change memory cells of the second region. The set operations, the reset operations, or any combination of the set and reset operations may be prohibited from being successively performed, more than a threshold number of times, on the first phase change memory cells of the first region or the second phase change memory cells of the second region.

According to some embodiments of the disclosure, a semiconductor memory device includes a nonvolatile memory having a first memory cell. A first sensor detects first information indicative of a first state of the first memory cell. A controller determines, based upon the first information, whether a first access operation may be executed upon the first memory cell.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the disclosure will now be described more fully with reference to the accompanying drawings, in which example embodiments are shown.

Figure 1:
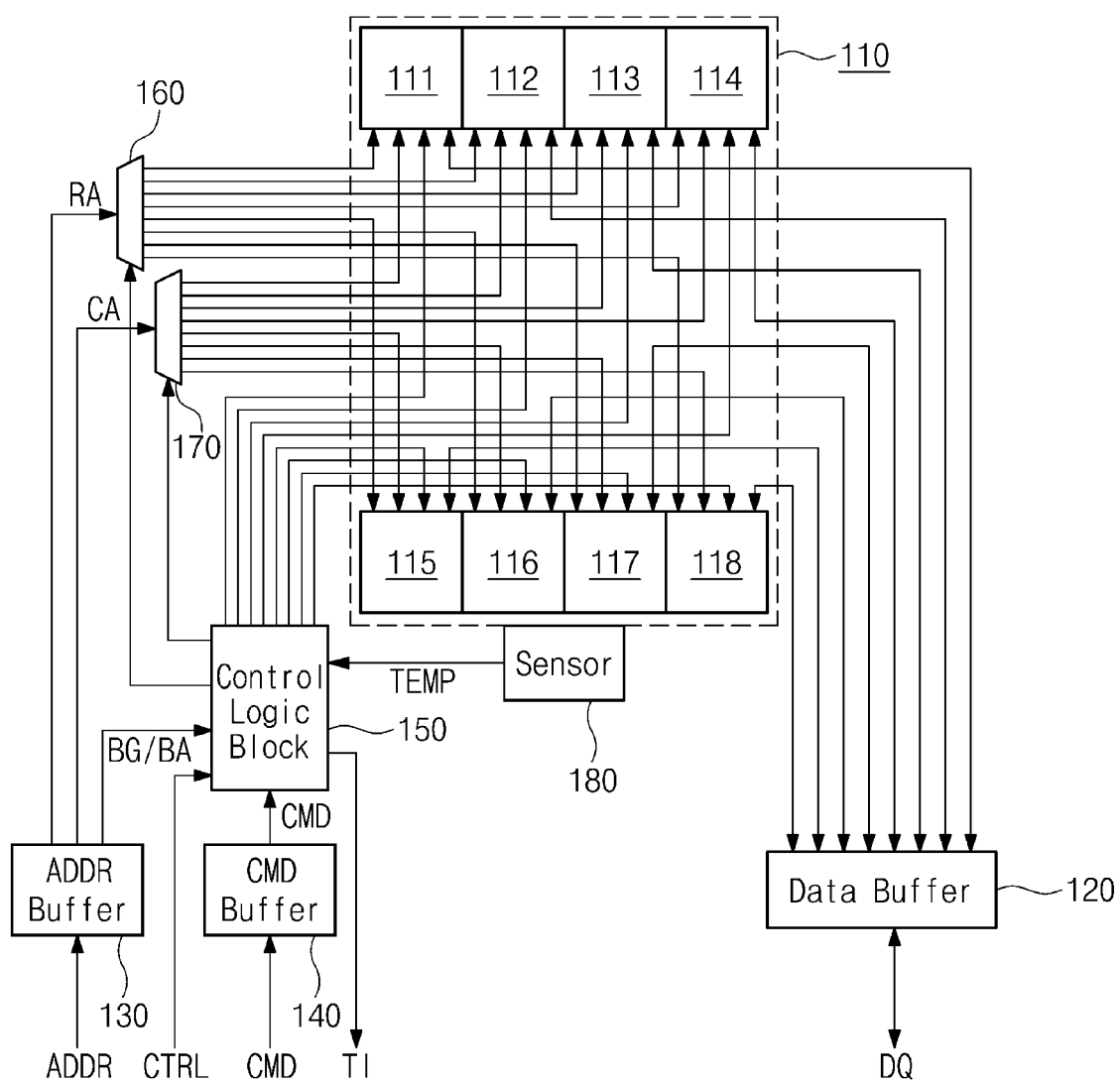
FIG. 1 is a block diagram illustrating a semiconductor memory device according to example embodiments of the disclosure.

FIG. 1 is a block diagram illustrating a semiconductor memory device 100 according to example embodiments of the disclosure. Referring to FIG. 1, the semiconductor memory device 100 may include a bank array 110, a data buffer 120, an address buffer 130, a command buffer 140, a control logic block 150, a first demultiplexer 160, a second demultiplexer 170, and a sensor 180.

The bank array 110 may include first to eighth banks 111-118. The first to eighth banks 111-118 may include memory cells for storing data (e.g., see FIG. 2). The first to eighth banks 111-118 may be configured to independently perform set operations, reset operations, or reading operations. The bank array 110 is illustrated to have eight banks, but the disclosure is not limited to this number of banks.

The data buffer 120 may exchange data signals DQ with a selected one of the first to eighth banks 111-118. In addition, the data buffer 120 may exchange the data signals DQ with an external device (e.g., a memory controller of FIG. 7).

The data buffer 120 may transfer the data signals DQ, which are transferred from a selected one of the banks, to the external device and may transfer the data signals DQ, which are transferred from the external device, to a selected one of the banks. The data buffer 120 may operate at an appropriate timing, under control of the control logic block 150.

The address buffer 130 may receive an address ADDR from an external device. The address buffer 130 may transfer bank information BG/BA in the received address ADDR to the control logic block 150. The bank information BG/BA may include a bank address, a bank group address, or both of the bank address and the bank group address.

The address buffer 130 may transfer a row address RA in the received address ADDR to the first demultiplexer 160. In addition, the address buffer 130 may transfer a column address CA in the received address ADDR to the second demultiplexer 170. The address buffer 130 may operate at an appropriate timing, under control of the control logic block 150.

The command buffer 140 may receive a command CMD from an external device. The command buffer 140 may transfer the received command CMD to the control logic block 150. The command buffer 140 may operate at an appropriate timing, under control of the control logic block 150.

The control logic block 150 may receive the bank information BG/BA from the address buffer 130. The control logic block 150 may receive the command CMD from the command buffer 140. The control logic block 150 may receive a control signal CTRL from an external device. The control logic block 150 may operate in accordance with the bank information BG/BA, the command CMD, and the control signal CTRL.

For example, the control logic block 150 may control operation timings of the data buffer 120, the address buffer 130, and the command buffer 140. The control logic block 150 may control the first demultiplexer 160 and the second demultiplexer 170. The control logic block 150 may control operations of the first to eighth banks 111-118.

The control logic block 150 may provide temperature information TI on a temperature TEMP sensed by the sensor 180 to an external device. For example, the control logic block 150 may output the temperature information TI to an external device, using a signal assigned to output the temperature information. As another example, the control logic block 150 may output the temperature information to the external device, through an alert signal (e.g., ALERTn) assigned to inform an anomalous state of the semiconductor memory device 100.

The first demultiplexer 160 may receive the row address RA from the address buffer 130. Under control of the control logic block 150, the first demultiplexer 160 may transfer the row address RA to one of the first to eighth banks 111-118. For example, the row address RA may be transferred to a bank selected by the bank information BG/BA.

The second demultiplexer 170 may receive the column address CA from the address buffer 130. Under control of the control logic block 150, the second demultiplexer 170 may transfer the column address CA to one of the first to eighth banks 111-118. For example, the column address CA may be transferred to a bank selected by the bank information BG/BA.

The sensor 180 may be disposed adjacent to the bank array 110. The sensor 180 may be provided for at least one bank of the first to eighth banks 111-118 or for each of the first to eighth banks 111-118. The sensor 180 may sense the temperature TEMP of a bank adjacent thereto and may provide the temperature TEMP to the control logic block 150.

Figure 2:
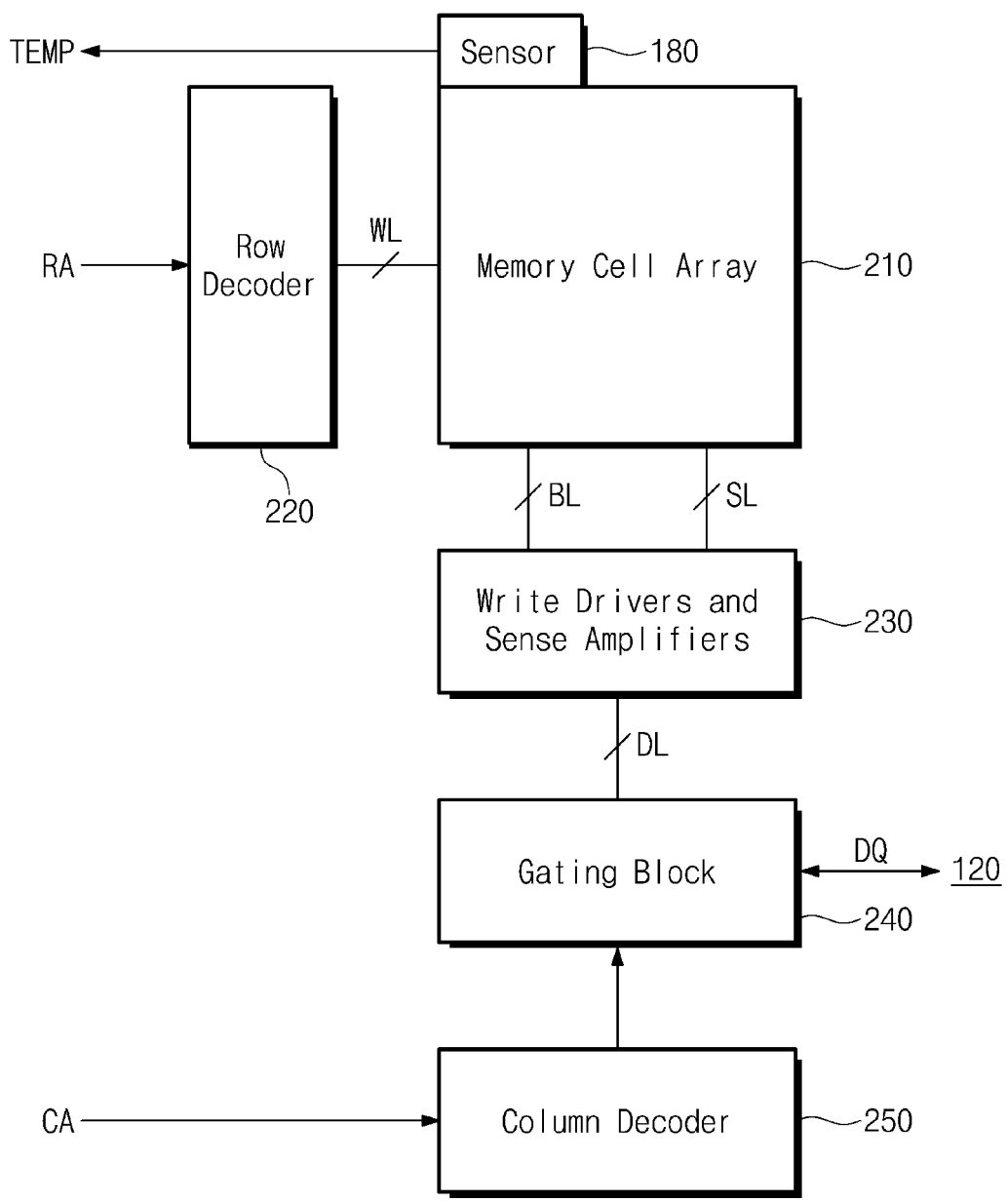
FIG. 2 is a block diagram illustrating a bank according to example embodiments of the disclosure.

FIG. 2 is a block diagram illustrating a bank 200 according to example embodiments of the disclosure. As an example, the bank 200 may be one of the first to eighth banks 111-118 shown in FIG. 1. Referring to FIGS. 1 and 2, the bank 200 may include a memory cell array 210, a row decoder 220, write drivers and sense amplifiers 230, a gating block 240, and a column decoder 250.

The memory cell array 210 may include memory cells, which are connected to word lines WL, bit lines BL, and source lines SL. For example, each row of the memory cells may be connected to one word line. Each column of the memory cells may be connected to one bit line and one source line. The memory cell array 210 may include phase change memory cells.

The row decoder 220 may be connected to the memory cell array 210 through the word lines WL. The row decoder 220 may receive the row address RA from the first demultiplexer 160. The row decoder 220 may select one of the word lines WL according to the row address RA. The row decoder 220 may apply a selection voltage or a selection current to a selected word line and may apply a non-selection voltage or a non-selection current to unselected word lines.

The write drivers and sense amplifiers 230 may be connected to the memory cell array 210 through the bit lines BL and the source lines SL. The write drivers and sense amplifiers 230 may apply voltages or currents to the bit lines BL or the source lines SL to write data in selected memory cells connected to a selected word line.

For example, the write drivers and sense amplifiers 230 may perform a set or reset operation on the selected memory cells to change resistance values of the selected memory cells and to write or erase data in the selected memory cells.

The write drivers and sense amplifiers 230 may sense voltages or currents of the bit or source lines BL or SL to read out data of the selected memory cells. For example, the write drivers and sense amplifiers 230 may perform the reading operation on the selected memory cells to examine ranges of resistance values of the selected memory cells and to read out data of the selected memory cells.

The gating block 240 may be connected to the write drivers and sense amplifiers 230 through data lines DL. The gating block 240 may operate under control of the column decoder 250. The gating block 240 may transfer the data signals DQ between the data buffer 120 and the write drivers and sense amplifiers 230. For example, the gating block 240 may connect some of the write drivers and some sense amplifiers, which are included in the write drivers and sense amplifiers 230, to the data buffer 120.

The column decoder 250 may receive the column address CA from the second demultiplexer 170. The column decoder 250 may control the gating block 240 according to the column address CA. For example, according to the column address CA, the gating block 240 may select some of the write drivers and some sense amplifiers.

The sensor 180 may be disposed adjacent to the memory cell array 210. The sensor 180 may be configured to sense a heating of the memory cells of the memory cell array 210. The sensor 180 may measure the temperature TEMP of a region near the memory cells of the memory cell array 210 and provide the measured temperature TEMP to the control logic block 150.

As an example, the gating block 240 may be shared by adjacent ones of the banks. The first to fourth banks 111-114 may share the gating block 240, and the fifth to eighth banks 115-118 may share the gating block 240. Some of the write drivers and sense amplifiers in the shared banks may be selected together by the gating block 240 in accordance with the column address CA.

Figure 3:
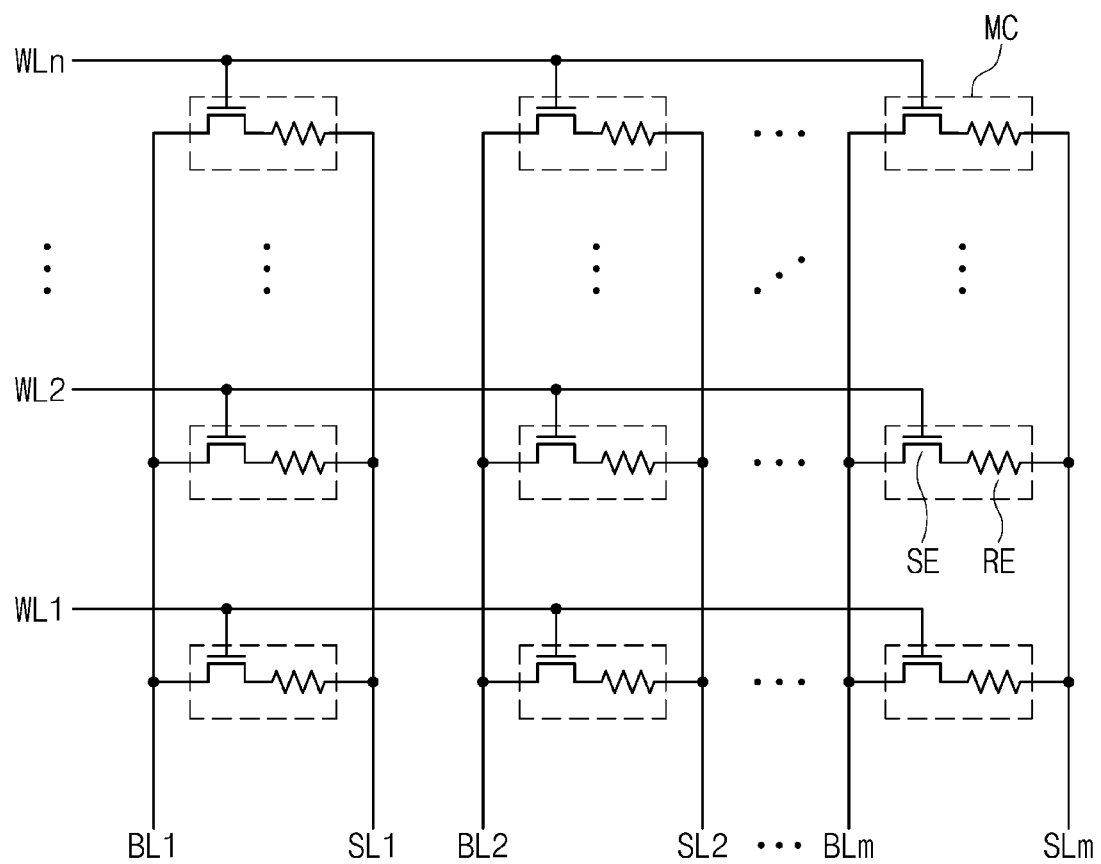
FIG. 3 illustrates a memory cell array according to example embodiments of the disclosure.

FIG. 3 illustrates the memory cell array 210 according to example embodiments of the disclosure. Referring to FIGS. 2 and 3, the memory cell array 210 may include memory cells MC. The memory cells MC may be arranged in rows and columns. The rows of the memory cells MC may be connected to first to n-th word lines WL1-WLn. The columns of the memory cells MC may be connected to first to m-th bit lines BL1-BLm and first to m-th source lines SL1-SLm.

Each of the memory cells MC may be connected to one word line, one bit line, and one source line. Each of the memory cells MC may include a selection element SE and a resistance element RE. The selection element SE may be controlled by a corresponding word line and may electrically connect the resistance element RE between a corresponding bit line and a corresponding source line. The selection element SE may include a transistor controlled by a voltage of the word line.

The resistance element RE may have a resistance value that can be changed by the set or reset operation. The resistance element RE, along with the selection element SE, may be connected between a corresponding bit line and a corresponding source line. The resistance element RE may include a phase change material whose resistance value is determined based on its crystalline state.

As an example, a diode, not the transistor, may be used as the selection element SE. In this case, the selection element SE and the resistance element RE may be connected between a corresponding word line and a corresponding bit line. For example, the source line may be omitted. As another example, the selection element SE may be omitted, and the resistance element RE may be connected between a corresponding word line and a corresponding bit line. The source line may be omitted.

Figure 4:
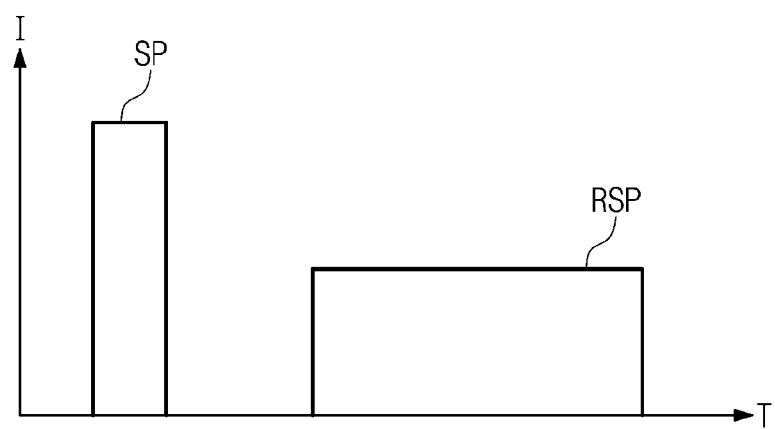
FIG. 4 illustrates an example of a set pulse and a reset pulse, which are respectively used to perform a set operation and a reset operation on memory cells.

FIG. 4 illustrates an example of a set pulse and a reset pulse, which are respectively used to perform a set operation and a reset operation on the memory cells MC. In FIG. 4, the horizontal and vertical axes represent time (T) and current amount (I), respectively.

Referring to FIGS. 3 and 4, when the set operation is performed, a set pulse SP may flow through the resistance element RE. When the reset operation is performed, a reset pulse RSP may flow through the resistance element RE. The set pulse SP may be applied to the resistance element RE during a time shorter than that of the reset pulse RSP. A current amount of the set pulse SP may be greater than that of the reset pulse RSP.

Figure 5:
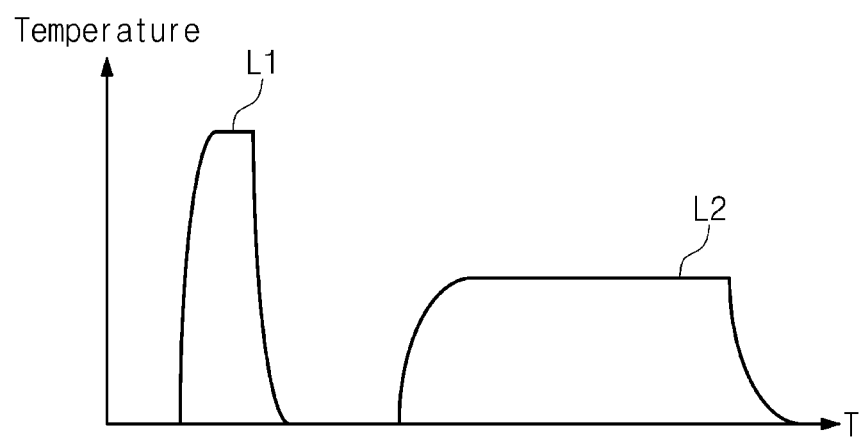
FIG. 5 illustrates an example of a change in temperature of a resistance element caused by a set pulse and a reset pulse.

FIG. 5 illustrates an example of a change in temperature of the resistance element RE caused by the set pulse SP and the reset pulse RSP. In FIG. 5, the horizontal axis represents time T and the vertical axis represents temperature of the resistance element RE. Referring to FIGS. 1 and 3 to 5, a first line L1 represents a temperature change caused by the set pulse SP, and a second line L2 represents a temperature change caused by the reset pulse RSP.

When the set pulse SP is applied, a large amount of current may flow through the resistance element RE during a short time interval. Thus, the temperature of the resistance element RE may be rapidly increased and then rapidly decreased, during a short time interval. The phase change material of the resistance element RE may become an amorphous state and may have a high resistance value.

When the reset pulse RSP is applied, a small amount of current may flow through the resistance element RE during a long time-interval. Thus, the temperature of the resistance element RE may be slowly increased and then slowly decreased. The highest temperature of the resistance element RE heated by the reset pulse RSP may be lower than that by the set pulse SP. The phase change material of the resistance element RE may become a crystalline state and may have a low resistance value.

As described above, the set and reset operations on the memory cells MC may be performed by heating the memory cells MC to a relatively high temperature during a short time interval or by heating the memory cells MC to relatively low temperature during a long time-interval. During the set and reset operations, the memory cells MC may be heated to a high temperature higher than a room temperature. When the set and reset operations are performed on a specific memory cell, temperatures of other memory cells adjacent to the specific memory cell may be increased, because of the heating of the specific memory cell.

In the case where the other adjacent memory cells are heated to a high temperature that causes the set or reset operation, data stored in the other adjacent memory cells may be lost or disturbed. To avoid the temperature-induced disturbance, the semiconductor memory device 100 may be configured to measure the temperature TEMP of the bank array 110 and to provide the temperature information TI or an external device. That is, the temperature TEMP of the bank array 110 may be managed.

Figure 6:
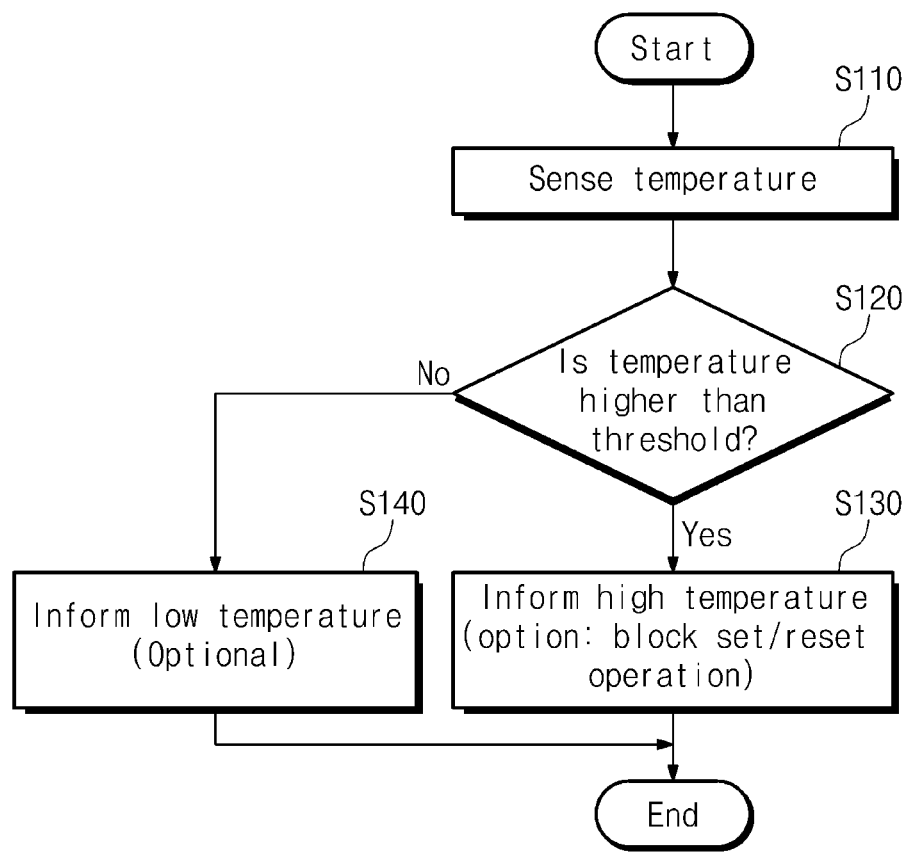
FIG. 6 is a flow chart illustrating a method of operating a semiconductor memory device, according to example embodiments of the disclosure.

FIG. 6 is a flow chart illustrating a method of operating the semiconductor memory device 100, according to example embodiments of the disclosure. Referring to FIGS. 1 and 6, in step S110, the sensor 180 may sense or measure the temperature TEMP of the bank array 110 and then provide information on the measured temperature TEMP to the control logic block 150.

For example, the sensor 180 may be disposed adjacent to one of the first to eighth banks 111-118 to provide the temperature TEMP of the bank to the control logic block 150. As another example, the sensor 180 may be disposed near each of the first to eighth banks 111-118 to provide the temperature TEMP of each of the first to eighth banks 111-118 to the control logic block 150.

In step S120, the control logic block 150 may determine whether the temperature TEMP is higher than a threshold temperature. For example, the control logic block 150 may determine whether the temperature TEMP of a specific bank or of the hottest bank of the first to eighth banks 111-118 is higher than the threshold temperature.

If the temperature TEMP is higher than the threshold temperature, the control logic block 150 may inform an external device that the temperature TEMP is higher than the threshold temperature, through the temperature information TI, in step S130. Optionally, the control logic block 150 may block the set or reset operation from being performed on a bank or banks having the temperature TEMP higher than the threshold temperature.

For example, when the external device receives the command CMD requesting the set or reset operation on a bank or banks having the temperature TEMP higher than the threshold temperature, the control logic block 150 may send a signal indicating an error or an anomalous state to the external device.

If the temperature TEMP is not higher than the threshold temperature, the control logic block 150 may inform the external device that the temperature TEMP is low, in step S140. In an embodiment, the step S140 may be optionally performed. When the temperature TEMP is not higher than the threshold temperature, the control logic block 150 may not take any action. In other words, the step S140 may be omitted.

For example, the threshold temperature may be set by the external device. The control logic block 150 may activate an alert signal (e.g., ALERTn) indicating an anomalous state to inform the external device that the temperature TEMP is higher than the threshold temperature. The alert signal may indicate that the semiconductor memory device 100 is in an anomalous state. The temperature TEMP higher than the threshold temperature may be one of anomalous states of the semiconductor memory device 100 that are informed to the external device.

For example, the first to eighth banks 111-118 may constitute a plurality of bank groups. As an example, the first to fourth banks 111-114 may constitute a first bank group, and the fifth to eighth banks 115-118 may constitute a second bank group. When the temperature TEMP of a specific bank is higher than the threshold temperature, the set or reset operation may be prevented from being performed on the specific bank or a bank group including the specific bank.

For example, when the temperature TEMP is higher than the threshold temperature, the set or reset operation may be prohibited during a predetermined time. The predetermined time may be set by the external device and may be, for example, 1 ms. The predetermined time may be determined in consideration of properties of the semiconductor memory device 100 or properties of a system including the semiconductor memory device 100.

When the set or reset operation is prohibited, the external device may again request the set or reset operation after the predetermined time has elapsed. In an embodiment, even when the temperature TEMP is higher than the threshold temperature, the control logic block 150 may permit the reading operation, regardless of the temperature TEMP.

Figure 7:
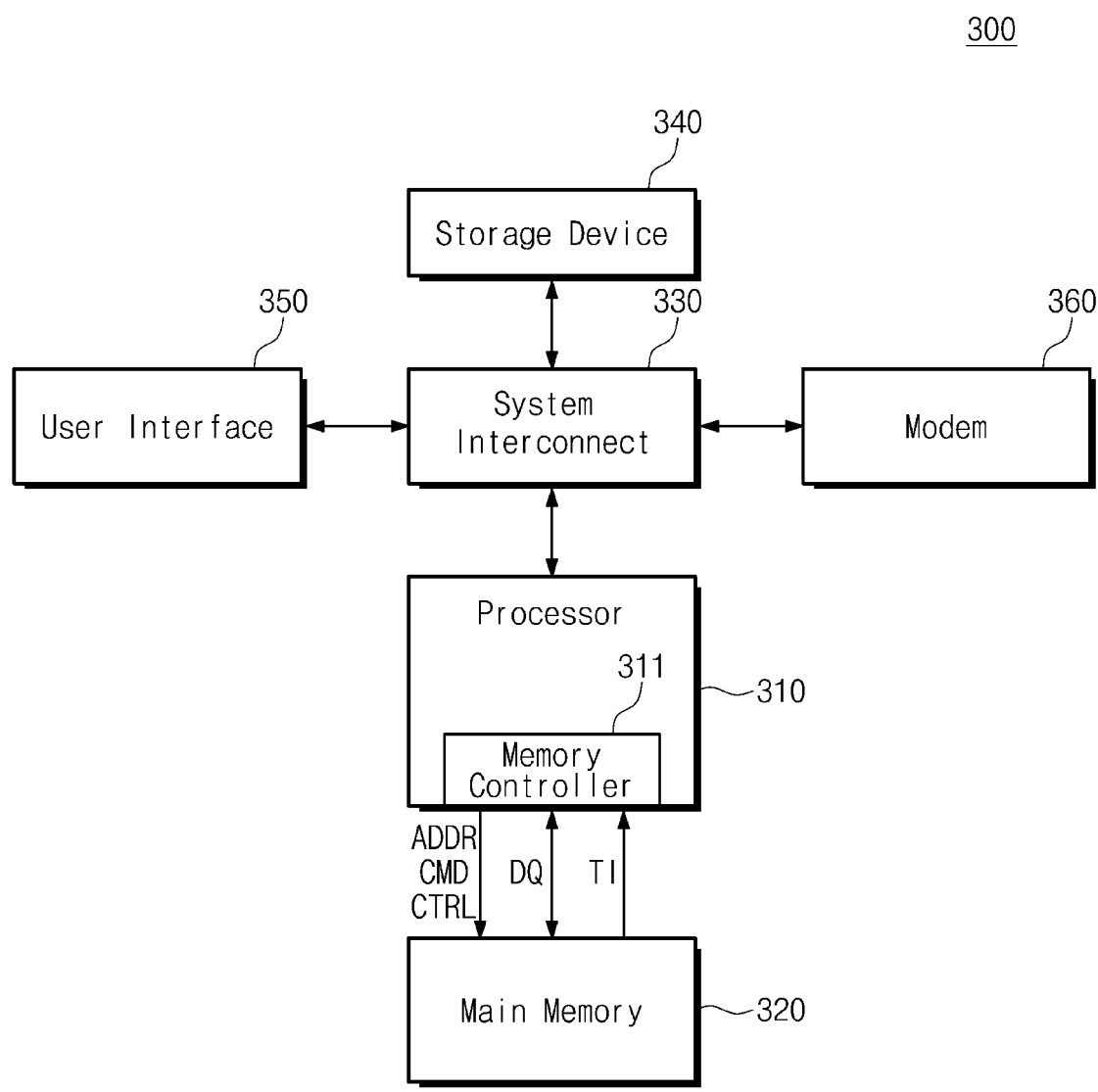
FIG. 7 is a block diagram illustrating a computing device according to example embodiments of the disclosure.

FIG. 7 is a block diagram illustrating a computing device 300 according to example embodiments of the disclosure. Referring to FIG. 7, the computing device 300 may be implemented with one of various computing devices such as a desktop computer, a notebook computer, a data server, an application server, a smart phone, and a smart tablet.

A processor 310 may be a central processing unit (CPU) or an application processor (AP) performing various operations. The processor 310 may be implemented with the central processing unit CPU or the application processor AP, which is combined with a graphic processing unit (GPU) or a neural processing unit (NPU).

The processor 310 may include a memory controller 311. The processor 310 may access a main memory 320 using the memory controller 311. The main memory 320 may perform a set operation, a reset operation, or a reading operation, under control of the memory controller 311.

The main memory 320 may receive the address ADDR, the command CMD, and the control signal CTRL from the memory controller 311. The main memory 320 may exchange the data signals DQ with the memory controller 311 and may provide the temperature information TI to the memory controller 311. The main memory 320 may include the semiconductor memory device 100 described with reference to FIG. 1.

A system interconnect 330 may provide channels between elements constituting the computing device 300. The system interconnect 330 may be implemented in accordance with one of various standards, such as peripheral component interconnect express (PCIe) and advanced microcontroller bus architecture (AMBA).

A storage device 340 may serve as a secondary memory of the computing device 300. The storage device 340 may have a slow access speed and a large storage capacity, compared with the main memory 320. The storage device 340 may include or be at least one of a hard disk drive (HDD), a solid-state drive (SSD), or portable memories.

A user interface 350 may exchange information with a user. The user interface 350 may include a user input interface (e.g., a keyboard, a mouse, a touch panel, or a microphone), which is used to receive information from a user, and a user output interface (e.g., a monitor, a speaker, and a motor), which is used to provide information to a user.

A modem 360 may be configured to allow for a wired or wireless communication with an external device. The modem 360 may be configured to support at least one of various standards such as LTE, Ethernet, WiFi, and Bluetooth. As an example, the modem 360 may be included in the processor 310.

As described with reference to FIGS. 1 to 6, the main memory 320 may include phase change memory cells. When the temperature TEMP of a specific bank or bank group of the phase change memory cells is higher than the threshold temperature, this may be informed from the main memory 320 to the memory controller 311 through the temperature information TI.

The memory controller 311 may control the set or reset operation on the main memory 320 in accordance with the temperature information TI to manage the temperature of the main memory 320. Thus, it may be possible to prevent the main memory 320 from being disturbed by the heating in the set or reset operation.

Figure 8:
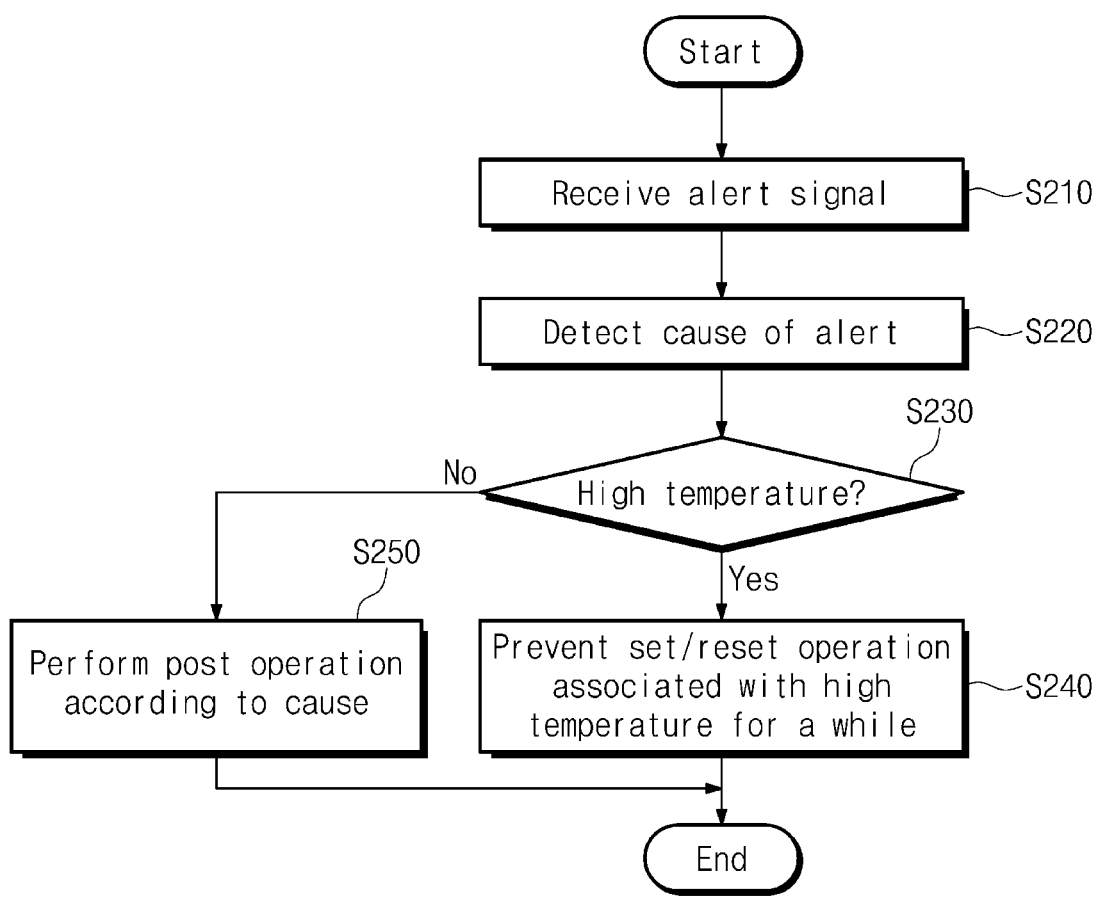
FIG. 8 is a flow chart illustrating an example of a method of obtaining temperature information using a memory controller or a processor including a memory controller.

FIG. 8 is a flow chart illustrating an example of a method of obtaining the temperature information TI using the memory controller 311 or the processor 310 including the memory controller 311. Referring to FIGS. 7 and 8, the memory controller 311 may receive an alert signal from the main memory 320, in step S210. The alert signal may indicate that the main memory 320 is in an anomalous state.

In step S220, the memory controller 311 or the processor 310 may detect a cause of the alert of the main memory 320. For example, the memory controller 311 or the processor 310 may detect the cause of the alert through reading of specific registers of the main memory 320.

In step S230, the memory controller 311 or the processor 310 may determine whether the alert is caused by a high temperature. In the case where the alert is determined to be caused by a high temperature, the memory controller 311 or the processor 310 may obtain the temperature information TI indicating high temperature. In step S240, the memory controller 311 or the processor 310 may temporarily prohibit the set or reset operation associated with the high temperature.

For example, the memory controller 311 or the processor 310 may prohibit the set or reset operation from being performed on a bank or bank group, on which the set or reset operation was performed immediately before the occurrence of the alert signal, for a while (e.g., during a predetermined time interval).

As another example, the memory controller 311 or the processor 310 may obtain information on a bank or bank group having a high temperature issue, when specific registers of the main memory 320 are read. The memory controller 311 or the processor 310 may prohibit the set or reset operation from being performed on the bank or bank group having the high temperature issue for a while. Thereafter, a process caused by the alert signal may be terminated.

In step S230, in the case where the alert is not determined to be caused by a high temperature, the memory controller 311 or the processor 310 may obtain the temperature information TI indicating low temperature. In step S250, the memory controller 311 or the processor 310 may perform a subsequent operation in accordance with a detected cause. Thereafter, a process caused by the alert signal may be terminated.

As described with reference to FIG. 8, the memory controller 311 or the processor 310 may obtain the temperature information TI of the main memory 320 by receiving the alert signal from the main memory 320 and performing a process of obtaining information in accordance with the alert signal.

As another example, the memory controller 311 or the processor 310 may receive the temperature information TI through a signal, which is dedicated to providing the temperature information TI when a temperature of a specific bank or bank group is higher than the threshold temperature. Here, the memory controller 311 or the processor 310 may directly perform the step S240, without performing the steps S210 to S230 and step S250.

Figure 9:
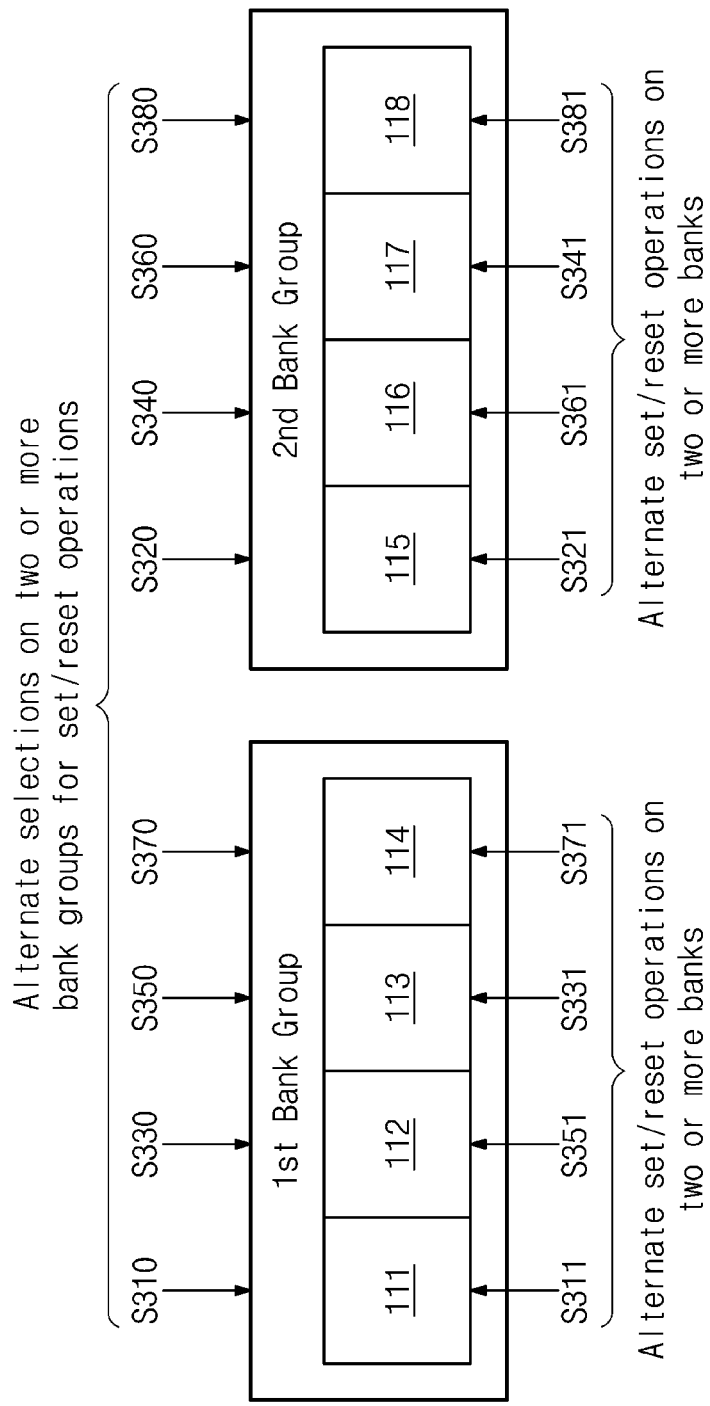
FIG. 9 illustrates an example of a method of accessing a main memory using a memory controller while preventing a frequent or concentric heating issue.

FIG. 9 illustrates an example of a method of accessing the main memory 320 using the memory controller 311 while preventing a frequent or concentric heating issue. As an example, it is assumed that the main memory 320 includes the first bank group and the second bank group, the first bank group includes the first to fourth banks 111-114, and the second bank group includes the fifth to eighth banks 115-118.

Referring to FIGS. 1, 7, and 9, in steps S310, S330, S350, and S370, the memory controller 311 may select the first bank group. In steps S320, S340, S360, and S380, the memory controller 311 may select the second bank group. Steps S310 to S380 may be sequentially performed.

In other words, the memory controller 311 may alternately select two or more bank groups, on which the set operations or reset operations will be performed. The alternate selecting of two or more bank groups may mean that the first bank group is selected at least one time or successively by a threshold number of times and then the first bank group is prohibited from being again selected.

In other words, the memory controller 311 may select the first bank group at least one time or a threshold number of times successively and then may select the second bank group without selecting the first bank group. The memory controller 311 may select the second bank group at least one time or a threshold number of times successively and then may select the first bank group without selecting the second bank group.

When the memory controller 311 performs the set or reset operation on the main memory 320, the memory controller 311 may introduce a rule for alternately selecting two or more bank groups of the main memory 320. Accordingly, it may be possible to prevent a specific bank group from being frequently or successively selected for the set or reset operation and thereby to prevent the specific bank group from being heated to a high temperature.

When the first bank group is selected (i.e., in steps S310, S330, S350, and S370), the memory controller 311 may perform each of steps S311, S331, S351, and S371. The steps S311, S331, S351, and S371 may be sequentially performed.

In other words, when the first bank group is selected, the memory controller 311 may perform the set operations or the reset operations on two or more banks alternately. To perform the set operations or reset operations on the two or more banks alternately means that the set or reset operation on the first bank 111 is performed at least one time or a threshold number of times successively and then the set or reset operation on the first bank 111 is prohibited.

In other words, the memory controller 311 may perform the set or reset operation on the first bank 111 at least one time or a threshold number of times successively and then may perform the set or reset operation on another bank, not the first bank 111.

In the case where there are three or more banks in each bank group, the memory controller 311 may perform the set operations or the reset operations on remote or non-adjacent banks in each bank group sequentially. For example, when the first bank group is selected, the memory controller 311 may perform the set or reset operation on the first bank 111 at least one time or a threshold number of times successively and then may perform the set or reset operation on the third bank 113, which is spaced apart from the first bank 111.

When the first bank group is selected, the memory controller 311 may perform the set or reset operation on a second bank 112 at least one time or a threshold number of times successively and then may perform the set or reset operation on the fourth bank 114, which is spaced apart from the second bank 112.

Similarly, when the second bank group is selected, the memory controller 311 may perform the set operations or the reset operations on the fifth to eighth banks 115-118 alternately (in steps S321, S341, S361, and S381). In addition, the memory controller 311 may perform the set or reset operation on a specific bank of the second bank group and then may perform the set or reset operation on a remote bank, which is spaced apart from the specific bank.

As an example, the memory controller 311 may select the first bank group and the second bank group alternately, and a bank, on which the set or reset operation is performed, may be changed when each bank group is selected. At timings for selecting a specific bank group, the set operations or the reset operations may be seen to be performed on banks of the specific bank group alternately.

For example, the memory controller 311 may select the first to eighth banks 111-118 in the order of steps S311, S321, S331, S341, S351, S361, S371, and S381 to perform the set or reset operation thereon. In addition, in the case where there are three or more bank groups, the memory controller 311 may be configured to select a specific bank group and then select another bank group spaced apart from the specific bank group.

As an example, in the case where there are four or more bank groups or banks, the memory controller 311 may select odd-numbered bank groups or banks sequentially to perform the set or reset operation thereon. Thereafter, the memory controller 311 may select even-numbered bank groups or banks sequentially to perform the set or reset operation thereon.

Figure 10:
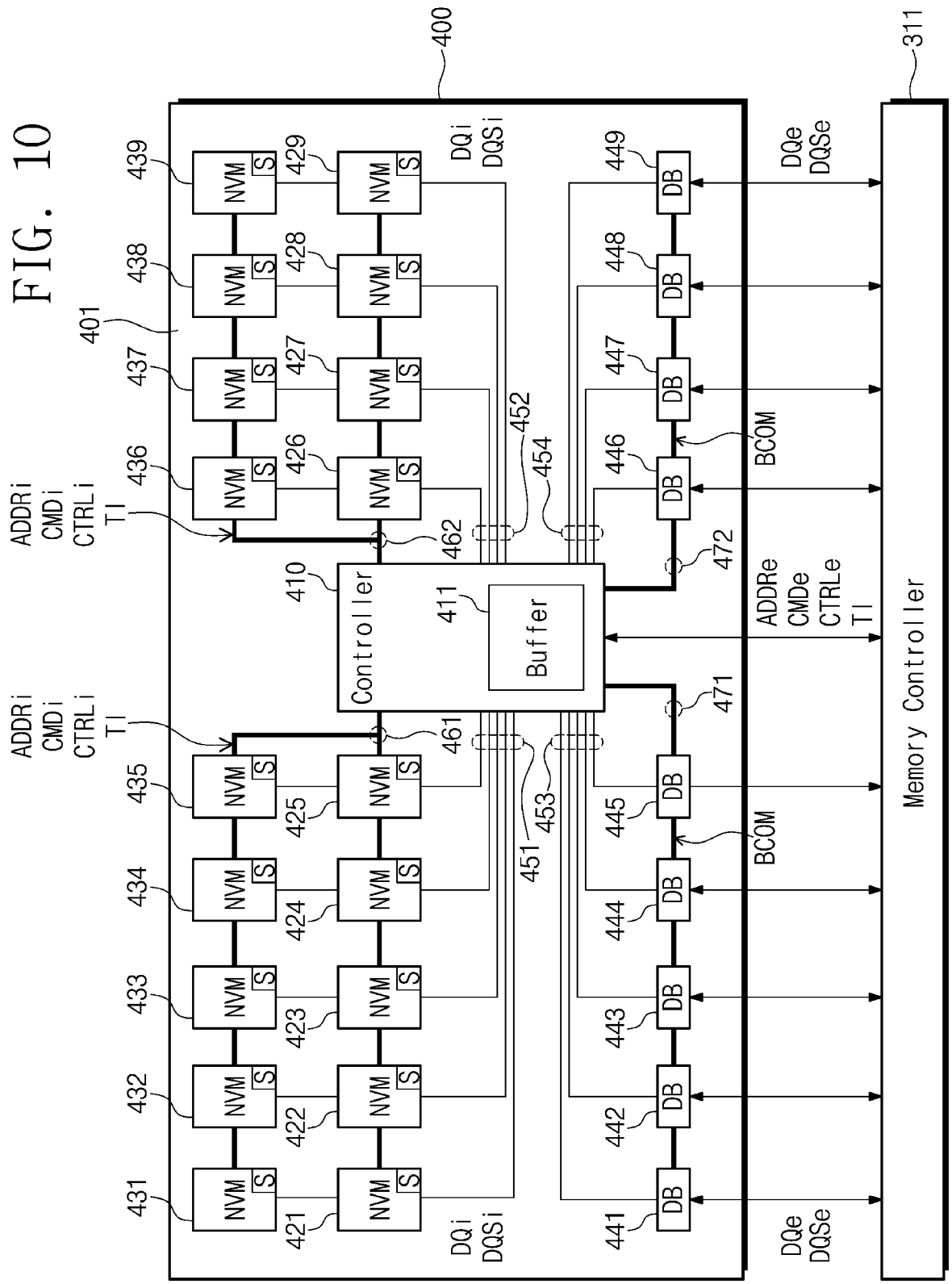
FIG. 10 is a block diagram illustrating a semiconductor memory module according to example embodiments of the disclosure.

FIG. 10 is a block diagram illustrating a semiconductor memory module 400 according to example embodiments of the disclosure. As an example, the semiconductor memory module 400 may be used as the main memory 320. Referring to FIGS. 1, 7, and 10, the semiconductor memory module 400 may include a controller 410, first nonvolatile memory devices 421-429, second nonvolatile memory devices 431-439, and data buffers 441-449.

The controller 410, the first nonvolatile memory devices 421-429, the second nonvolatile memory devices 431-439, and the data buffers 441-449 may be implemented as respective semiconductor packages and may be respectively mounted on a printed circuit board 401.

Each of the first and second nonvolatile memory devices 421-429 and 431-439 may be configured to have the same or similar structure as that of FIG. 1. For example, a sensor S may be provided in each of the first and second nonvolatile memory devices 421-429 and 431-439.

The controller 410 may receive an external address ADDRe, an external command CMDe, and an external control signal CTRLe from an external memory controller 311. The external address ADDRe may be received as a set of address signals, and the external command CMDe may be received as a set of command signals.

The controller 410 may be connected to the first and second nonvolatile memory devices 421-429 and 431-439 through first data lines 451 and 452. For example, one (e.g., 421) of the first nonvolatile memory devices 421-429 and a corresponding one (e.g., 431) of the second nonvolatile memory devices 431-439 may be connected in common to one of the first data lines 451 and 452.

Each of the first data lines 451 and 452 may include two or more lines (e.g., eight lines) for transferring internal data signals DQi and at least one line (e.g., two lines) for transferring internal data strobe signals DQSi.

The controller 410 may control the first and second nonvolatile memory devices 421-429 and 431-439 through first control lines 461 and 462. The first control lines 461 and 462 may be connected in common to the first and second nonvolatile memory devices 421-429 and 431-439.

The controller 410 may generate an internal address ADDRi from the external address ADDRe, may generate an internal command CMDi from the external command CMDe, and may generate an internal control signal CTRLi from the external control signal CTRLe. The controller 410 may transfer the internal address ADDRi, the internal command CMDi, and the internal control signal CTRLi through the first control lines 461 and 462 to control the first and second nonvolatile memory devices 421-429 and 431-439.

The controller 410 may obtain the temperature information TI from the first and second nonvolatile memory devices 421-429 and 431-439 through the first control lines 461 and 462 or a particularly assigned line.

As described with reference to FIGS. 1 to 6, each of the first and second nonvolatile memory devices 421-429 and 431-439 may transfer a signal, which is dedicated to indicating a high temperature issue when the temperature TEMP is higher than the threshold temperature, or transfer an alert signal indicating an anomalous state.

If the signal dedicated to indicating the high temperature issue or the alert signal from at least one of the first and second nonvolatile memory devices 421-429 and 431-439 is transferred to the controller 410, the controller 410 may transfer the dedicated signal or the alert signal to the memory controller 311. For example, outputs of the first and second nonvolatile memory devices 421-429 and 431-439 transferring the dedicated signal or the alert signal may be connected in common to a single line to have a wired OR structure.

As another example, the sensor S may be managed by the controller 410, not by each of the first and second nonvolatile memory devices 421-429 and 431-439. For example, each of the first and second nonvolatile memory devices 421-429 and 431-439 may not perform any operation associated with the sensor S.

The sensor S may be connected to the controller 410 through a dedicated line. When a temperature sensed or measured by the sensor S is higher than the threshold temperature, the controller 410 may transfer a dedicated signal or an alert signal to the memory controller 311.

As an example, the first nonvolatile memory devices 421-429 may be accessed at the same time, and the second nonvolatile memory devices 431-439 may be accessed at the same time. The sensor S may be provided in at least one of the first nonvolatile memory devices 421-429, and the sensor S may be provided in at least one of the second nonvolatile memory devices 431-439. The controller 410 may determine whether the first and second nonvolatile memory devices 421-429 and 431-439 are in a high temperature or frequent or concentric heated state, based on the temperature sensed by at least one sensor S.

The controller 410 may be connected to the first to ninth data buffers 441-449 through second data lines 453 and 454. The controller 410 may control the first to ninth data buffers 441-449 through second control lines 471 and 472. The controller 410 may transfer a buffer command BCOM to the second control lines 471 and 472 according to the external command CMDe and the external control signal CTRLe to control the first to ninth data buffers 441-449.

The memory controller 311 may directly transfer the external address ADDRe, the external command CMDe and the external control signal CTRLe to the controller 410. The memory controller 311 may obtain the temperature information TI from the controller 410. The memory controller 311 may transfer external data signals DQe and external data strobe signals DQSe to the controller 410 through the first to ninth data buffers 441-449.

The controller 410 may convert the internal data signals DQi and the external data signals DQe to each other. The controller 410 may include a buffer 411, which is used for a buffering between signals (e.g., ADDRe, CMDe, CTRLe, and DQe), which are used for communication with the memory controller 311, and signals (e.g., ADDRi, CMDi, CTRLi, and DQi), which are used for communication with the first and second nonvolatile memory devices 421-429 and 431-439.

The memory controller 311 may identify the first nonvolatile memory devices 421-429 as one rank (e.g., a first rank) and may identify the second nonvolatile memory devices 431-439 as another rank (e.g., a second rank). The memory controller 311 may request the controller 410 to access the nonvolatile memory devices included in each rank at the same time. The controller 410 may support a rank-based access in accordance with the request of the memory controller 311.

For example, when the memory controller 311 requests the set, reset, or reading operation on the first rank, the controller 410 may perform the set, reset, or reading operation on the first rank. When the memory controller 311 requests the set, reset, or reading operation on the second rank, the controller 410 may perform the set, reset, or reading operation on the second rank.

The controller 410 may transfer the external data signals DQe, which are transferred from the memory controller 311 for the set or reset operation, to the first rank or the second rank as the internal data signals DQi. The controller 410 may transfer the internal data signals DQi, which are read from the first rank or the second rank by the reading operation, to the memory controller 311 as the external data signals DQe.

Figure 11:
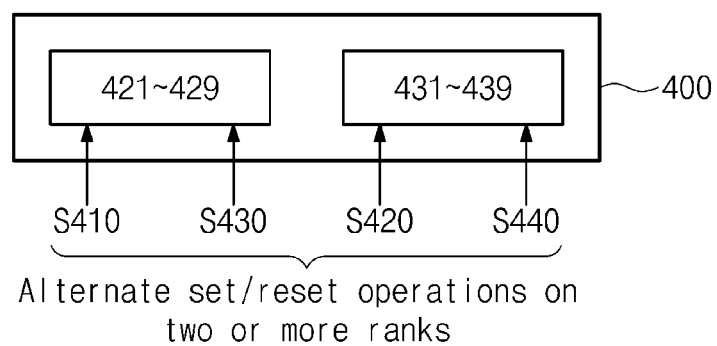
FIG. 11 illustrates an example of a set or reset operation, which is performed on a first rank and a second rank of a semiconductor memory module by a memory controller, for preventing a frequent or concentric heating issue.

FIG. 11 illustrates an example of a set or reset operation, which is performed on the first rank 421-429 and the second rank 431-439 of the semiconductor memory module 400 by the memory controller 311, for preventing a frequent or concentric heating issue. Referring to FIGS. 7, 10, and 11, in steps S410 to S440, the memory controller 311 may perform the set or reset operations on two or more ranks alternately.

For example, similar to the example of FIG. 9 in which each bank group is selected, the memory controller 311 may select the ranks alternately to perform the set or reset operations. As an example, there may be three or more ranks in the semiconductor memory module 400. The memory controller 311 may perform the set or reset operation on a specific rank and then may perform the set or reset operation on another remote rank spaced apart from the specific rank.

Figure 12:
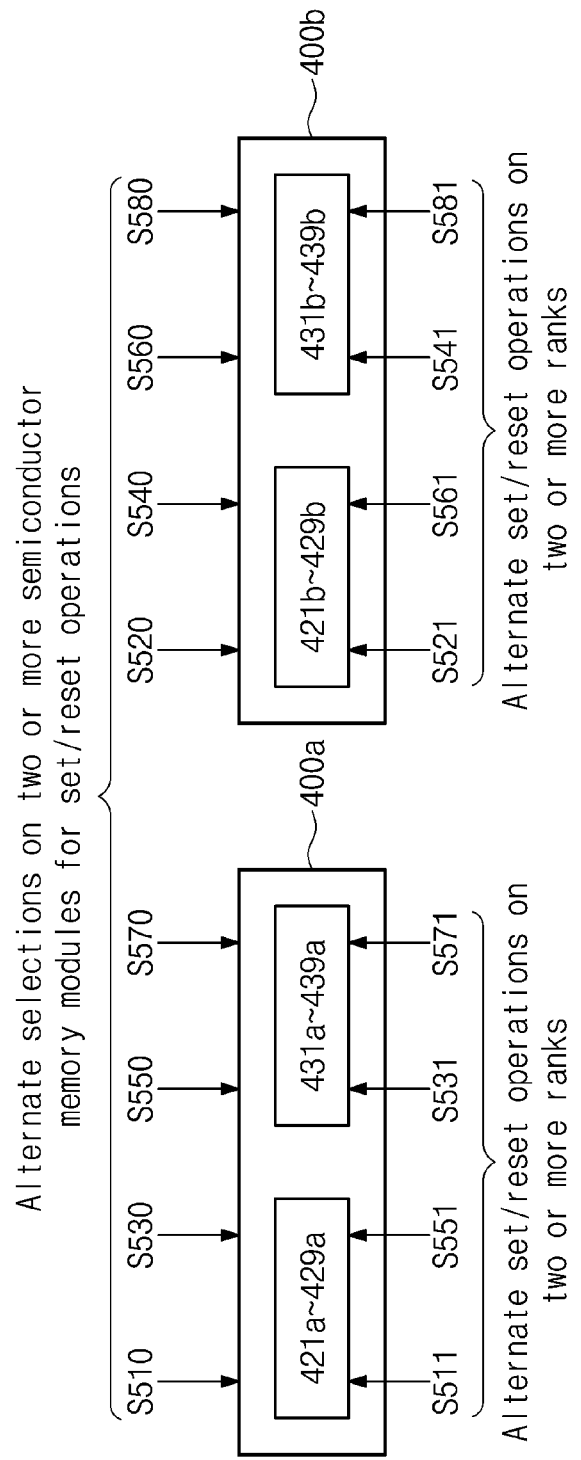
FIG. 12 illustrates an example in which a memory controller accesses two semiconductor memory modules for preventing a frequent or concentric heating issue.

FIG. 12 illustrates an example, in which the memory controller 311 accesses two semiconductor memory modules 400a and 400b, for preventing a frequent or concentric heating issue. Referring to FIGS. 7 and 12, the main memory 320 may include a first semiconductor memory module 400a and a second semiconductor memory module 400b. The first semiconductor memory module 400a and the second semiconductor memory module 400b may have the same structure as the semiconductor memory module 400 described with reference to FIG. 10.

The first semiconductor memory module 400a may include a first rank 421a-429a and a second rank 431a-439a. The second semiconductor memory module 400b may include a third rank 421b-429b and a fourth rank 431b-439b.

In steps S510, S530, S550, and S570, the memory controller 311 may select the first semiconductor memory module 400a. In steps S520, S540, S560, and S580, the memory controller 311 may select the second semiconductor memory module 400b. Steps S510 to S580 may be sequentially performed.

In other words, the memory controller 311 may alternately select two or more semiconductor memory modules to perform the set or reset operations. The alternate selection of the two or more semiconductor memory modules may mean that the first semiconductor memory module 400a is selected at least one time or a threshold number of times successively and then is prohibited from being again selected.

When the memory controller 311 performs the set or reset operation on the main memory 320, the memory controller 311 may introduce a rule for alternately selecting two or more semiconductor memory modules of the main memory 320. Accordingly, it may be possible to prevent a specific semiconductor memory module from being frequently or successively selected for the set or reset operation and thereby to prevent the specific semiconductor memory module from being heated to a high temperature.

When the first semiconductor memory module 400a is selected (i.e., steps S510, S530, S550, and S570), the memory controller 311 may perform each of steps S511, S531, S551, and S571. Steps S511, S531, S551, and S571 may be sequentially performed.

In other words, when the first semiconductor memory module 400a is selected, the memory controller 311 may perform the set or reset operations on two or more ranks (e.g., 421a-429a and 431a-439a) alternately. In the case where there are three or more ranks in each semiconductor memory module, the memory controller 311 may perform the set or reset operations on remote or non-adjacent ranks, which are provided in each semiconductor memory module, sequentially.

Similarly, when the second semiconductor memory module 400b is selected, the memory controller 311 may perform the set or reset operations on the third rank 421b-429b and the fourth rank 431b-439b alternately (e.g., in the order of steps S521, S541, S561, and S581).

As an example, the memory controller 311 may select the first semiconductor memory module 400a and the second semiconductor memory module 400b alternately, and a rank, on which the set or reset operation is performed, may be changed when each semiconductor memory module is selected. At timings for selecting a specific semiconductor memory module, the set operations or the reset operations may be seen to be alternately performed on ranks.

For example, the memory controller 311 may select the first to fourth ranks 421a-4219a, 431a-439a, 421b-429b, and 431b-439b in the order of steps S511, S521, S531, S541, S551, S561, S571, and S581 to perform the set or reset operation thereon. In addition, in the case where there are three or more semiconductor memory modules, the memory controller 311 may be configured to select a specific semiconductor memory module and then select another semiconductor memory module, which is located spaced apart from the specific semiconductor memory module.

As an example, in the case where there are four or more ranks, the memory controller 311 may select odd-numbered ranks sequentially to perform the set or reset operation thereon. Thereafter, the memory controller 311 may select even-numbered ranks sequentially to perform the set or reset operation thereon.

As described above, according to some embodiments of the disclosure, a semiconductor memory device or a semiconductor memory module may be configured to provide temperature information to an external memory controller and thereby to support a temperature management function. In addition, the semiconductor memory device or the semiconductor memory module may prohibit the set or reset operation from being performed on frequent or concentric heated memory cells, and this may make it possible to prevent data stored in the memory cells from being thermally disturbed.

In the semiconductor memory device or semiconductor memory module according to some embodiments of the disclosure, an access operation (e.g., the set or reset operation) may be performed on banks, bank groups, ranks, or semiconductor memory modules alternately. Thus, it may be possible to prevent the set or reset operation from being concentrically performed on a specific bank, a specific bank group, a specific rank, or a specific semiconductor memory module and thereby to prevent a frequent or concentric heating issue.

In the afore-described embodiments, examples in which the set operations or reset operations are prohibited on a specific physical element or are performed on at least two different physical elements alternately. The reading operation may be allowed in any case and in any order, regardless of the set or reset operations.

In the above-described embodiments, components according to embodiments of the disclosure are referred to by using the term "block". The "block" may be implemented with hardware, such as an integrated circuit (IC), an application specific IC (ASIC), a field programmable gate array (FPGA), and a complex programmable logic device (CPLD), software, such as firmware and applications driven in hardware devices, or combinations of hardware and software. In addition, the "block" may include circuits or intellectual property (IP), which are implemented with semiconductor devices in an IC.

According to example embodiments of the disclosure, temperature information of memory cells may be reported. A heating process in memory cells may be managed, based on the temperature information. In addition, in some embodiments, different memory cells may be alternately accessed. Thus, it may be possible to prevent an access operation, which results in heating of memory cells, from being concentrically performed on specific memory cells.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While example embodiments of the disclosure have been particularly shown and described, it will be understood by one of ordinary skill in the art that variations in form and detail may be made therein without departing from the spirit and scope of the attached claims.

What is claimed is:

1. A semiconductor memory device comprising:
   banks;
   a sensor, disposed adjacent to the banks, that senses a temperature;
   an address buffer that receives an address from an external device;
   a first demultiplexer that transfers a row address, which is a first part of the address received by the address buffer, to one of the banks;
   a second demultiplexer that transfers a column address, which is a second part of the address received by the address buffer, to one of the banks;
   a command buffer that receives a command from the external device;
   a control logic that controls the first demultiplexer, the second demultiplexer, and the banks in accordance with the command received by the command buffer and bank information, which is a third part of the address received by the address buffer; and
   a data buffer that exchanges data signals between the banks and the external device, wherein
   the control logic transfers temperature information of the temperature sensed by the sensor to the external device.

2. The semiconductor memory device of claim 1, wherein the control logic transfers the temperature information to the external device when the temperature is higher than a threshold temperature.

3. The semiconductor memory device of claim 1, wherein:
   each of the banks comprises phase change memory cells, and
   the control logic prohibits a set operation or a reset operation from being performed on the phase change memory cells of each of the banks when the temperature is higher than a threshold temperature.

4. The semiconductor memory device of claim 1, wherein:
   the sensor comprises temperature sensors disposed adjacent to the banks, respectively,
   the temperature is sensed by a specific temperature sensor among the temperature sensors, and
   the control logic transfers the temperature information to the external device when the temperature is higher than a threshold temperature.

5. The semiconductor memory device of claim 1, wherein:

each of the banks comprises phase change memory cells, the sensor comprises temperature sensors disposed adjacent to the banks, respectively, the temperature is sensed by a specific temperature sensor among the temperature sensors, and the control logic prohibits a set operation or a reset operation from being performed on a bank adjacent to the specific temperature sensor of the banks when the temperature sensed by the specific temperature sensor is higher than a threshold temperature.

6. The semiconductor memory device of claim 5, wherein:

the banks are divided into two bank groups, each of which includes two of the banks, the control logic prohibits a set operation or a reset operation from being performed on a specific bank group, among the two bank groups, in which a first bank adjacent to the specific temperature sensor is included, and the banks include the first bank.

7. The semiconductor memory device of claim 1, wherein the control logic transfers the temperature information to the external device by sending an alert signal, which indicates an anomalous state of the semiconductor memory device, to the external device.

8. The semiconductor memory device of claim 1, wherein each of the banks comprises:

a memory cell array including phase change memory cells;

a row decoder, connected to the memory cell array through word lines, that selects a word line of the word lines in accordance with the row address that is transferred from the first demultiplexer;

write drivers and sense amplifiers, connected to the memory cell array through bit lines and source lines, that perform a set, reset, or reading operation on phase change memory cells, which are connected to the word line selected by the row decoder;

a gating circuit connecting some of the write drivers and the sense amplifiers to the data buffer; and a column decoder that receives the column address from the second demultiplexer and controls the gating circuit in accordance with the column address.

9. A semiconductor memory module comprising:

first nonvolatile memory devices;

a first temperature sensor associated with a second nonvolatile memory device of the first nonvolatile memory devices;

third nonvolatile memory devices;

a second temperature sensor associated with a fourth nonvolatile memory device of the third nonvolatile memory devices;

data buffers; and a controller that exchanges first data signals with the data buffers through first data lines and exchanges second data signals with the first nonvolatile memory devices and the third nonvolatile memory devices through second data lines, wherein the controller:

receives a first address, a first command, and a first control signal from an external device to control the first nonvolatile memory devices and the third nonvolatile memory devices through first control lines and to control the data buffers through second control lines in accordance with the first address, the first command and the first control signal, and outputs temperature information of a temperature sensed by the first temperature sensor or the second temperature sensor to the external device.

10. The semiconductor memory module of claim 9, wherein the controller outputs the temperature information to the external device when the temperature is higher than a threshold temperature.

11. The semiconductor memory module of claim 9, wherein:

the first temperature sensor is included in the second nonvolatile memory device, the second temperature sensor is included in the fourth nonvolatile memory device, the second nonvolatile memory device or the fourth nonvolatile memory device transfers the temperature information to the controller when the temperature sensed by the first temperature sensor or the second temperature sensor is higher than a threshold temperature, and the controller outputs the temperature information, which is transferred from the second nonvolatile memory device or the fourth nonvolatile memory device, to the external device.

12. The semiconductor memory module of claim 9, wherein:

each of the first nonvolatile memory devices and the third nonvolatile memory devices comprises phase change memory cells, the controller prohibits a set operation or a reset operation from being performed on the first nonvolatile memory devices when the temperature sensed by the first temperature sensor is higher than a first threshold temperature, and the controller prohibits the set operation or the reset operation from being performed on the third nonvolatile memory devices when the temperature sensed by the second temperature sensor is higher than a second threshold temperature.

13. The semiconductor memory module of claim 9, wherein the first temperature sensor is provided in each of the first nonvolatile memory devices and the second temperature sensor is provided in each of the third nonvolatile memory devices.

14. The semiconductor memory module of claim 9, wherein the controller transfers the temperature information to the external device by sending an alert signal, which indicates an anomalous state of one of the first nonvolatile memory devices and the third nonvolatile memory devices, to the external device.

15. The semiconductor memory module of claim 9, wherein the controller performs a reading operation on the first nonvolatile memory devices and the third nonvolatile memory devices regardless of the temperature.

* * * * *